(12) United States Patent
Nakamura

(10) Patent No.: US 6,346,679 B1
(45) Date of Patent: Feb. 12, 2002

(54) SUBSTRATE ON WHICH BALL GRID ARRAY TYPE ELECTRICAL PART IS MOUNTED AND METHOD FOR MOUNTING BALL GRID ARRAY TYPE ELECTRICAL PART ON SUBSTRATE

(75) Inventor: Taisuke Nakamura, Saitama (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/635,478

(22) Filed: Aug. 8, 2000

(30) Foreign Application Priority Data

Aug. 27, 1999 (JP) .......................... 11-241294

(51) Int. Cl.[7] .................. H05K 1/16; H01L 23/48
(52) U.S. Cl. ................ 174/260; 174/259; 174/261; 174/262; 174/264; 361/760; 361/767; 361/768; 361/777; 257/737; 257/778
(58) Field of Search .................. 174/260, 259, 174/261, 262, 263, 264; 361/760, 764, 765, 767, 768, 777, 803, 807, 808, 769, 770, 771, 772, 773, 774; 257/737, 698, 707, 778, 779

(56) References Cited

U.S. PATENT DOCUMENTS

| | | |
|---|---|---|
| 4,642,163 A | 2/1987 | Greschner et al. |
| 4,867,839 A | 9/1989 | Sato et al. |
| 5,011,066 A * | 4/1991 | Thompson .............. 228/180.21 |
| 5,489,750 A * | 2/1996 | Sakemi et al. .............. 174/261 |
| 5,973,406 A * | 10/1999 | Harada et al. .............. 257/780 |
| 6,081,038 A * | 6/2000 | Murayama .................. 257/783 |
| 6,142,609 A * | 11/2000 | Aoki ............................ 347/50 |
| 6,222,277 B1 * | 4/2001 | Downes ...................... 257/778 |
| 6,225,702 B1 * | 5/2001 | Nakamura .................. 257/786 |

FOREIGN PATENT DOCUMENTS

| | | |
|---|---|---|
| EP | 0 590 635 A1 | 9/1993 |
| GB | 2 344 463 A | 12/1999 |
| JP | 7-147481 | 6/1995 |
| JP | 8-125325 | 5/1996 |
| JP | 9-45805 | 2/1997 |
| JP | 10-163371 | 6/1998 |
| JP | 10-346025 | 12/1998 |
| JP | 11-74637 | 3/1999 |

* cited by examiner

Primary Examiner—Jeffrey Gaffin
Assistant Examiner—I. B. Patel
(74) Attorney, Agent, or Firm—McGinn & Gibb, PLLC

(57) ABSTRACT

In a substrate on which a ball grid allay type electrical part is mounted includes a substrate body, a normal land, an integrated land and a connection reinforcement section. The substrate body provided with a ball grid allay type electrical part. On the normal land, a normal electrode of the ball grid array type electrical part is connected. On the integrated land, a plurality of integrated electrodes of the ball grid allay type electrical part is connected. The connection reinforcement section connects to the integrated land to the substrate body

17 Claims, 3 Drawing Sheets

SUBSTRATE ON WHICH BALL GRID ARRAY TYPE ELECTRICAL PART IS MOUNTED AND METHOD FOR MOUNTING BALL GRID ARRAY TYPE ELECTRICAL PART ON SUBSTRATE

BACKGROUND OF THE INVENTION

1. Field of the Invention

The present invention relates to a substrate on which a BGA (Ball Grid Array) type electrical part is mounted, and a method for mounting the BGA type electrical part on the substrate.

2. Description of the Related Art

A plurality of electrodes is mounted on a rear surface of a BGA electrical part. A plurality of lands is mounted on a front surface of a substrate on which the BGA electrical part is mounted. An array of the electrodes and an array of the lands are matched with each other. The electrode is connected to the land through solder. This connection enables the BGA electrical part to be fixed to the substrate.

The technique for mounting the BGA electrical part on the substrate is disclosed in Japanese Laid Open Patent Applications JP-A-H7-147481, JP-A-H8-125325, JP-A-H9-45805, JP-A-H10-163371 and JP-AH11-74637 and Japanese Patent Application Filing Number H10-346025 corresponding to U.S. patent application Filing Ser. No. 09/435,448. Those documents disclose the technique for connecting one land to one electrode.

The mounting of the BGA electrical part on the substrate requires a countermeasure for protecting a crack caused by heat cycle stress. The mounting of the BGA electrical part requires a countermeasure for protecting a damage caused by external stress. Those countermeasures are done by using a curing agent or a resin adhesive (hereafter, merely referred to as an adhesive). If the adhesive is filled between the BGA electrical part and the substrate, it is possible to improve the bond strength between the BGA electrical part and the substrate.

Increase in a mount density of the substrate causes an interval between the BGA electrical part and a peripheral part to be narrow. If the interval is narrow, the adhesive for the BGA electrical part comes in contact with the peripheral part. The adhesive disturbs the radiation from the peripheral part. The adhesive semi-permanently attaches the BGA electrical part and the peripheral part to the substrate. The BGA electrical part and the peripheral part are not easily dismounted from the substrate. If trouble is induced in the BGA electrical part and the peripheral part, it is impossible to replace the BGA electrical part and the peripheral part.

The applicant already filed a patent with regard to an invention for improving bond strength without using an adhesive (Japanese Patent Application Filing Number H10-346025). This application discloses a substrate (printed circuit substrate) is provided with a normal land to which a normal electrode of a BGA electrical part is bonded and an integrated land to which a plurality of integrated electrodes of the electrical part are bonded. Bond strength between the BGA electrical part and the electrode is stronger than bond strength between the substrate and the land. Bond strength between the substrate and the BGA electrical part depends on the bond strength between the substrate and the land. Its bond strength has a value that has no influence on a usual usage environment. The occurrences of a strong force for stripping the BGA electrical part from the substrate causes the BGA electrical part together with the land to be stripped from the substrate.

SUMMARY OF THE INVENTION

It is an object of the present invention is to provide a substrate on which the BGA type electrical part is mounted and a method for mounting the electrical part on the substrate. On the substrate and in the method, the BGA electrical part together with the land is never stripped by the heat cycle stress from the substrate.

In order to achieve an aspect of the present invention, a substrate on which a ball grid allay type electrical part is mounted includes a substrate body (2), a normal land (3), an integrated land (4) and connection reinforcement section (5). The substrate body (2) provided with a ball grid allay type electrical part. On the normal land (3), a normal electrode (12) of the ball grid array type electrical part (10) is connected. On the integrated land (4), a plurality of integrated electrodes (13) of the ball grid allay type electrical part (10) is connected. The connection reinforcement section (5) connects to the integrated land (4) to the substrate body (2).

In the above substrate, the connection reinforcement section (5) is a through section which pierces the integrated land and the substrate body.

In the above substrate, the connection reinforcement section (5) is a convexity section which pass through the integrated land to inside of the substrate body.

In the above substrate, the integrated land (4) has a surface area which is wider than a surface area of the normal land (3).

In the above substrate, the integrated land (4) is a grounding land supplying a ground potential.

In the above substrate, the integrated land (4) is a power supply land supplying a power potential.

In the above substrate, the integrated land (4) is a signal land supplying a data signal.

In the above substrate, the connection reinforcement section (5) is a through pipe which pierces the integrated land and the substrate body from a front surface of the substrate body to a rear surface thereof.

In the above substrate, the connection reinforcement section is a retiring shape section which pierces the integrated land and is embedded in the substrate body.

In order to achieve an aspect of the present invention, a method of mounting ball grid array type electrical part on substrate includes connecting of a normal electrode (12) of a ball grid allay type electrical part to normal land. The method further includes connecting a plurality of connecting integrated terminals (13) of a ball grid allay type electrical part to an integrated land of a substrate body (2). In the connecting of the normal electrode (12), the normal electrode (12) of a ball grid array type electrical part (10) is connected on a normal land (3) of a substrate body (2) via a connecting material (22). In the connecting of the plurality of integrated terminals (13), the plurality of integrated terminals (13) of the ball grid array type electrical part (10) is connected on an integrated land (4). The integrated land (4) is connected to a substrate body (2) by a connection reinforcement section (5).

In the above method, the connecting material (22) is made of a solder.

In the above method, the connection reinforcement section (5) has a through pipe which pierces the integrated land (4) and the substrate body (2). The connecting material (22) is flowed into the through pipe.

In the above method, the connection reinforcement section (5) has a retiring shape section which pierces the integrated land (4) and retires the substrate body (2). The connecting material (22) is flowed into the connection reinforcement section (5).

In the above method, a surface area of the integrated land (4) is wider than a surface area of the normal land (3).

In the above method, a ground potential for the ball grid array type electrical part (10) is applied to the integrated land (4).

In the above method, a power potential for the ball grid array type electrical part (10) is applied to the integrated land (4).

In the above method, a data signal for the ball grid array type electrical part (10) is supplied to the integrated land (4).

In the above method, the connection reinforcement section (5) is a through pipe which pierces the integrated land (4) and the substrate body (2) from a front surface of the substrate body (2) to a rear surface thereof.

In the above method, the connection reinforcement section (5) is a retiring shape section which pierces the integrated land and is embedded in the substrate body (2)

DESCRIPTION OF THE PREFERRED EMBODIMENTS

Figure 1:
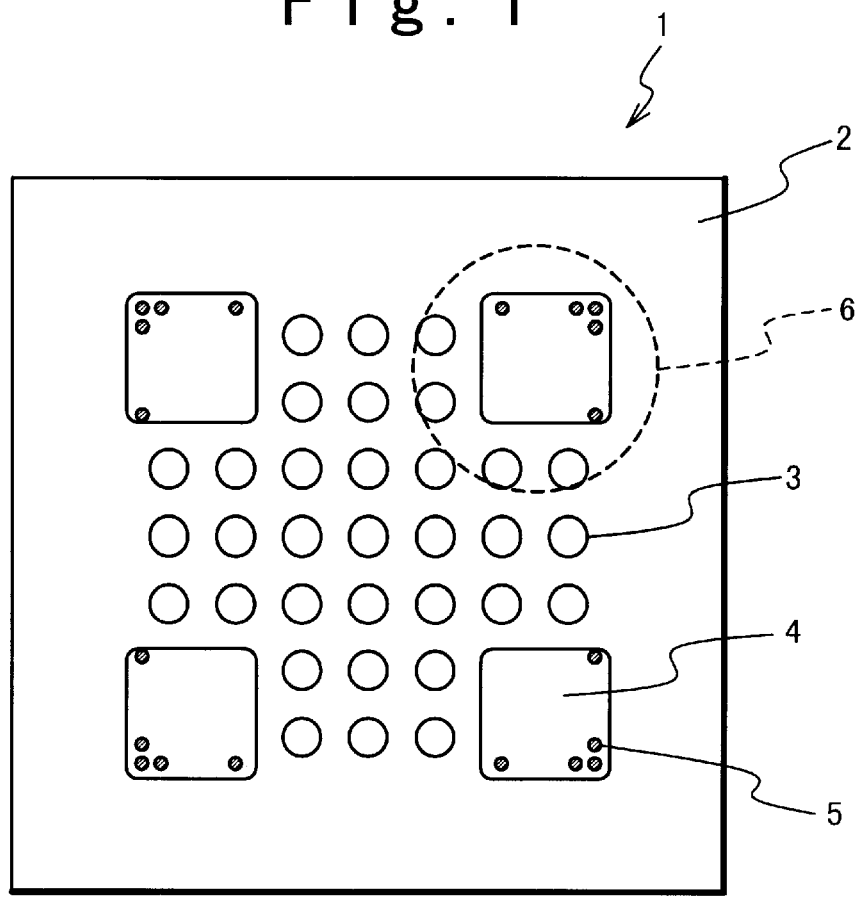
FIG. 1 shows a surface of a substrate according to the present invention.

FIG. 1 shows a surface of a substrate in the present invention. A substrate 1 shown in FIG. 1 has a substrate body 2. The substrate 1 has 33 normal lands 3. The substrate 1 has four integrated lands 4. Each of the integrated lands 4 has five connection reinforcement sections 5.

The substrate body 2 is an insulation plate having a wiring pattern on a surface thereof. The normal land 3 is fixed to the surface of the substrate body 2. The normal land 3 is bonded to a signal line (not shown) mounted on the surface of the substrate body 2. The integrated land 4 is fixed to the surface of the substrate body 2. The integrated land 4 is bonded to a ground line (not shown) mounted on the surface of the substrate body 2. The connection reinforcement section 5 is fixed to the integrated land 4 and the substrate body 2. The connection reinforcement sections 5 are arranged along an outer edge of the integrated land 4. The integrated land 4 is directly fixed to the surface of the substrate body 2. The integrated land 4 is fixed through the connection reinforcement section 5 to the substrate body 2.

The normal land 3 is a conductor. The integrated land 4 is a conductor. The connection reinforcement section 5 is made of resin.

Figure 2:
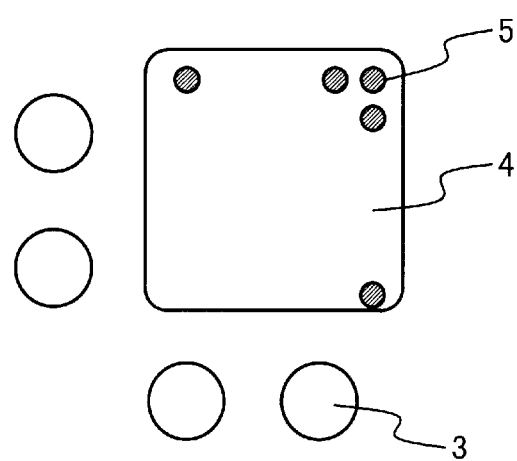
FIG. 2 shows an integrated land of the substrate according to the present invention.

FIG. 2 shows the integrated land according to the present invention. The connection reinforcement sections 5 are exposed on the surface of the integrated land 4 shown in FIG. 2. The connection reinforcement sections 5 are mounted at ends of the integrated land 4. The integrated electrode of the BGA electrical part is not opposite to the connection reinforcement section 5. The surface on the integrated land 4 has an area to which the four integrated electrodes are opposite. The surface of the integrated land 4 has the area equal to or four times the area of the normal land 3.

Figure 3:
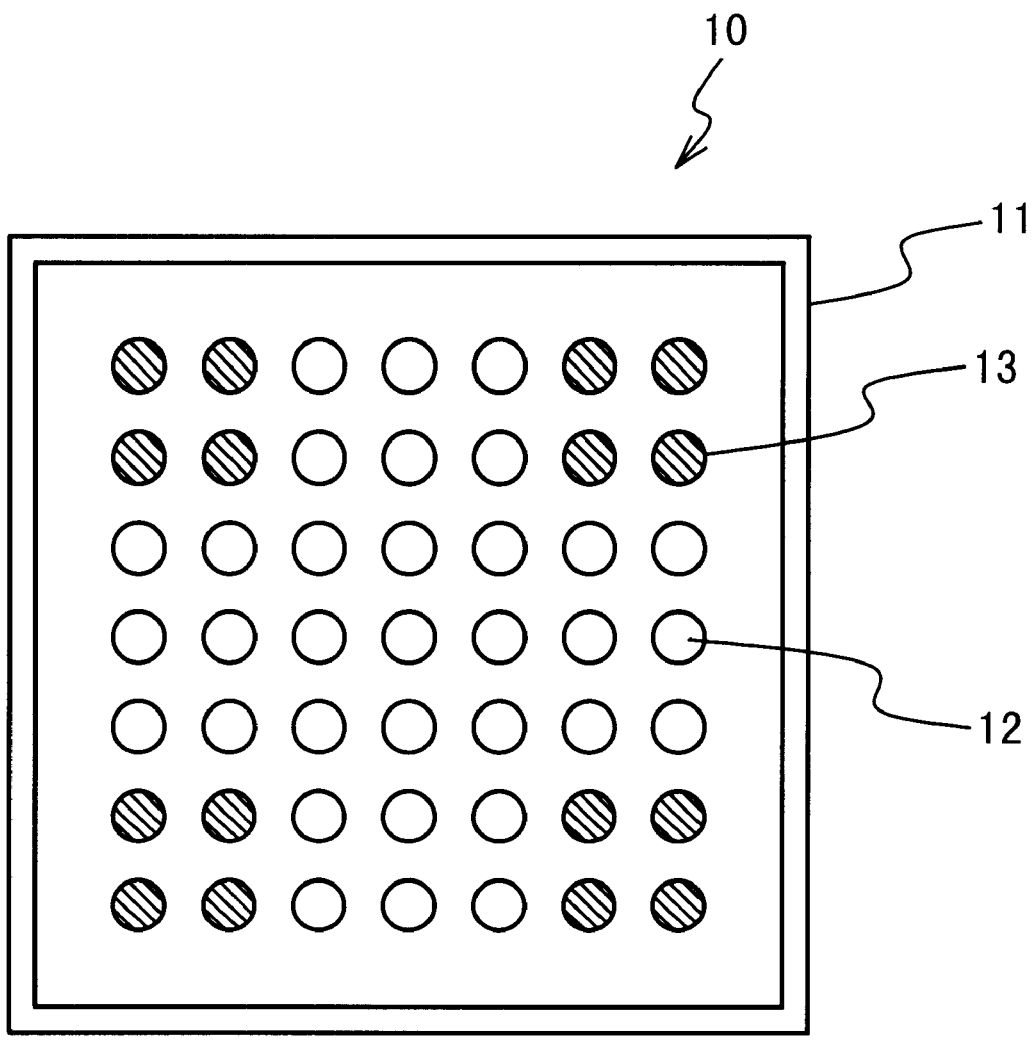
FIG. 3 shows a rear of a BGA electrical part.

FIG. 3 shows an electrode array of the BGA electrical part. A BGA electrical part 10 shown in FIG. 3 has a part substrate body 11, and has 33 normal electrodes 12. The BGA electrical part 10 has 16 integrated electrodes 13.

The normal electrodes 12 are fixed to a rear of the part substrate body 11. The integrated electrodes 13 are fixed to the rear of the part substrate body 11.

Each of the normal electrodes 11 is connected to an inner circuit (not shown) of the BGA electrical part 10. Each of the integrated electrodes 12 is connected to an inner circuit (not shown) of the BGA electrical part 10.

The normal electrode 11 has an array matched with an array of the normal land 3 (FIG. 1). The integrated electrode 12 has an array matched with that of the integrated land 4 (FIG. 1).

The normal electrode 11 is used to transmit a signal. The normal electrode 11 is used to apply a power supply voltage. The integrated electrode 12 is used to apply a ground potential.

Figure 4:
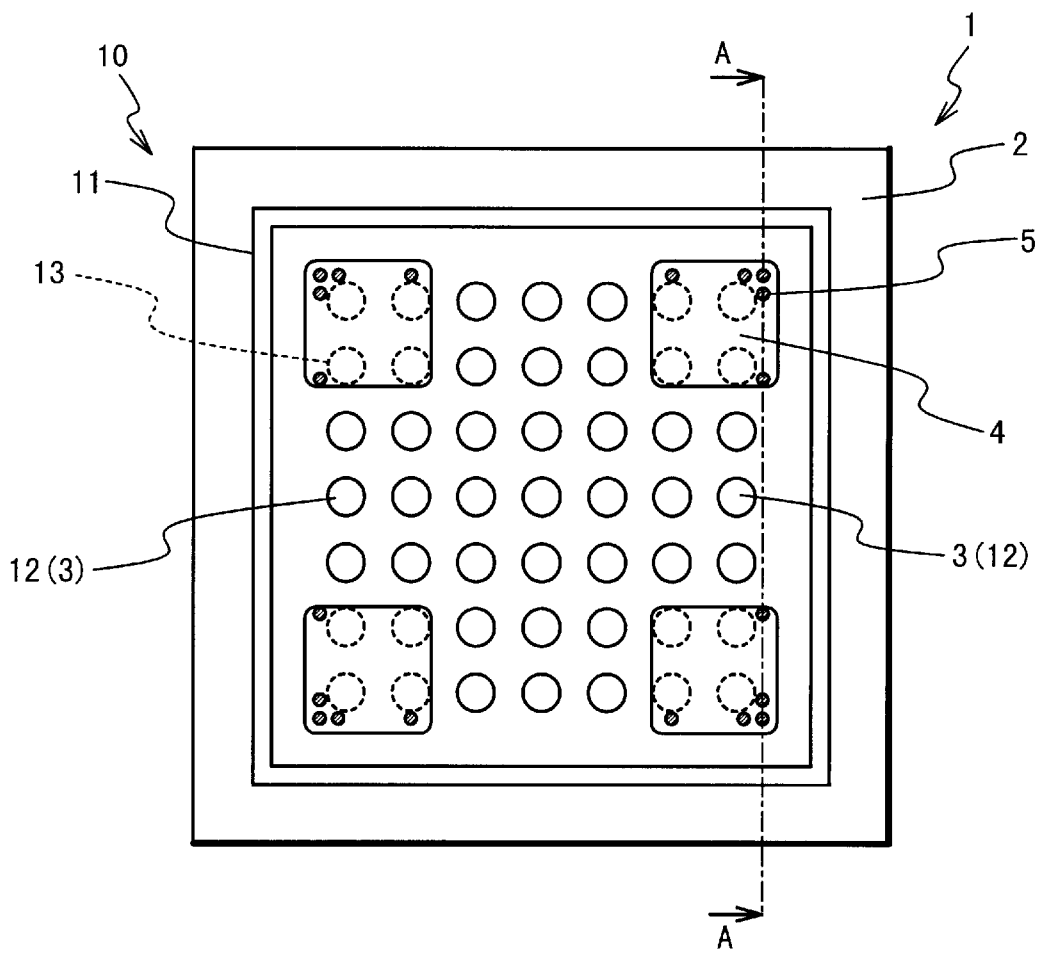
FIG. 4 shows a mount condition of the substrate according to the present invention.

FIG. 4 shows a mount condition according to the present invention. The substrate 1 shown in FIG. 4 is shown in FIG. 1. The BGA electrical part 10 shown in FIG. 4 is shown in FIG. 3.

The normal land 3 on the substrate 1 is opposite to the normal electrode 11 of the BGA electrical part 10. The integrated land 4 on the substrate 1 is opposite to the integrated electrode 12 of the BGA electrical part 10. One integrated land 4 is opposite to the four integrated electrodes 12.

Figure 5:
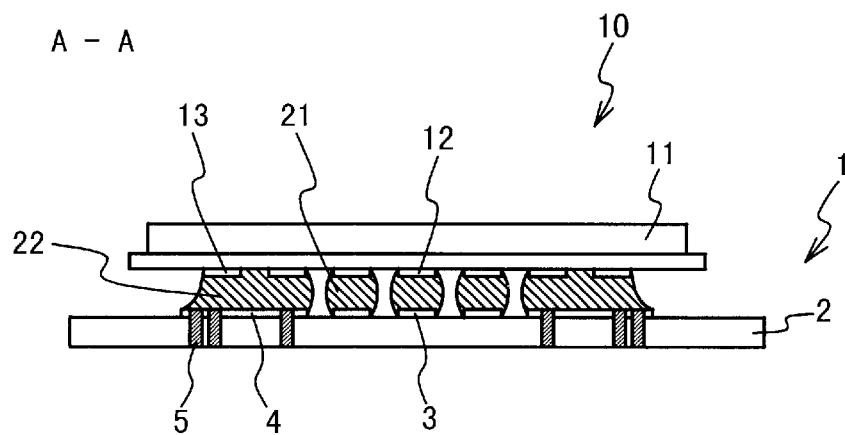
FIG. 5 shows a connection condition of the substrate according to the present invention.

FIG. 5 shows a solder connection condition according to the present invention. FIG. 5 shows an end surface in which the configuration of FIG. 4 is cut in an A—A direction.

The normal land 3 of the substrate 1 is fixed to the surface of the substrate body 2. The integrated land 4 is fixed to the surface of the substrate body 2. The connection reinforcement section 5 is fixed to the integrated land 4 and the substrate body 2. The integrated land 4 is directly fixed to the surface of the substrate body 2. The integrated land 4 is fixed through the connection reinforcement section 5 to the substrate body 2.

The normal electrode 12 of the BGA electrical part 10 is fixed to the part substrate body 11. The integrated electrode 13 of the BGA electrical part 10 is fixed to the part substrate body 11.

The normal electrode 12 is opposite to the normal land 3. The integrated electrode 13 is opposite to the integrated land 3.

The normal electrode 12 is connected through a solder 21 to the normal land 3. The integrated electrode 13 is connected through a solder 22 to the integrated land 4. Four integrated electrodes 13 are connected to one integrated land 4. The solder 22 is connected to the entire surface of the integrated land 4. The solder 22 is filled between four integrated lands 13.

Bond strength between the integrated electrode 13 and the integrated land 4 is stronger than bond strength between four normal electrodes 12 and four normal lands 3. A bond strength between the integrated land 4 and the substrate body 2 is represented by the sum of a bond strength at which the integrated land 4 is directly fixed to the substrate body 2 and a bond strength at which the integrated land 4 is fixed through the connection reinforcement section 5 to the substrate body 2. A force required to pull out the connection reinforcement section 5 from the substrate body 2 is stronger than a force required to strip the integrated land 4 from the substrate body 2. It is possible to largely improve bond strength between the substrate 1 and the BGA electrical part 10.

In the embodiment, the connection reinforcement section 5 penetrates the substrate body 2 and the integrated land 4 (a penetration type via). The connection reinforcement section 5 may be designed such that a part thereof penetrates the substrate body 2 and/or the integrated land 4 (a blind via). The connection reinforcement section 5 may be a penetration tube of a conductor. The penetration tube may be integrated with the integrated land 4. The connection reinforcement section 5 may be a concave member of a conductor. The concave member may be integrated with the integrated land 4. The solder on the integrated land 4 is filled in the penetration tube and the concave member.

In the embodiment, the four integrated lands 4 are mounted at Four Corners of the substrate 1. The number of integrated lands 4 and the arrangement positions thereof are not limited in particular. One integrated land may be mounted at a center of the substrate 1.

In the embodiment, the four integrated electrodes 13 are connected to one integrated land 4. The number of integrated electrodes 13 connected to the integrated land 4 is not limited in particular. Desirably, it is at least two. The number may be one if the size of the integrated electrode 13 is larger than that of the normal electrode 12.

In the embodiment, the five connection reinforcement sections 5 are mounted in one integrated land 4. However, the number of connection reinforcement sections 5 is not limited in particular. It may be one.

In the embodiment, the connection reinforcement section 5 is different in material from the integrated land 4 and the substrate body 2. However, the connection reinforcement section 5 may have the same material as the integrated land 4 or the substrate body 2.

The connection reinforcement section 5 may have the emboss structure that it is mounted on a land side contact surface and a substrate body side contact surface with which the integrated land 4 and the substrate body 2 are in contact. This emboss structure is formed such that the substrate body side contact surface and the land side contact surface are matched with each other.

The present invention can protect the crack caused by the heat cycle stress and the damage caused by the external stress without using the adhesive. The present invention can avoid the BGA electrical part together with the land from being stripped from the substrate.

What is claimed is:

1. A substrate on which a ball grid array type electrical part is mounted comprising:
    a substrate body provided with a ball grid array type electrical part;
    a normal land connected to a normal electrode of the ball grid array type electrical part;
    an integrated land connected to a plurality of integrated electrodes of the ball grid array type electrical part; and
    a connection reinforcement section connected to said integrated land and connected to said substrate body, said connection reinforcement section connected to said substrate at an inner portion of said substrate below said substrate surface.

2. A substrate on which a ball grid array type electrical part is mounted as claimed in claim 1,
    wherein the connection reinforcement section comprises a through section which pierces the integrated land and the substrate body.

3. A substrate on which a ball grid array type electrical part is mounted as claimed in claim 1,
    wherein the integrated land has a surface area which is wider than a surface area of the normal land.

4. A substrate on which a ball grid array type electrical part is mounted as claimed in claim 1,
    wherein the integrated land comprises a grounding land supplying a ground potential.

5. A substrate on which a ball grid array type electrical part is mounted as claimed in claim 1,
    wherein the integrated land comprises a power supply land supplying a power potential.

6. A substrate on which a ball grid array type electrical part is mounted as claimed in claim 1,
    wherein the integrated land comprises a signal land supplying a data signal.

7. A substrate on which a ball grid array type electrical part is mounted as claimed in claim 1,
    wherein the connection reinforcement section comprises a through pipe which pierces the integrated land and the substrate body from a front surface of the substrate body to a rear surface thereof.

8. The substrate as claimed in claim 1, wherein a connection of the integrated land to the substrate body has a bond strength which comprises the sum of a bond strength at which the integrated land is directly fixed to the substrate body and a bond strength at which the integrated land is fixed through said connection reinforcement section to the substrate body.

9. The substrate as claimed in claim 1, wherein a strength of a force required to pull out said connection reinforcement section from said substrate body is greater than a force required to strip said integrated land from said substrate body.

10. The substrate as claimed in claim 1, wherein said normal land is bonded to a surface of the substrate body with a connecting material.

11. The substrate as claimed in claim 10, wherein said connecting material is solder.

12. The substrate as claimed in claim 1, wherein said connection reinforcement section comprises a connecting material.

13. The substrate as claimed in claim 12, wherein said connecting material is solder.

14. A substrate on which a ball grid array type electrical part is mounted comprising:
    a substrate body provided with a ball grid array type electrical part;
    a normal land connected to a normal electrode of the ball grid array type electrical part;
    an integrated land connected to a plurality of integrated electrodes of the ball grid array type electrical part; and
    means for reinforcing a connection of said integrated land and said substrate body, said connection reinforcing means connected to said substrate at an inner portion of said substrate below said substrate surface.

15. The substrate as claimed in claim 14, wherein a connection of the integrated land to the substrate body has a bond strength which comprises the sum of a bond strength at which the integrated land is directly attached to the substrate body and a bond strength at which the integrated land is attached through said connection reinforcing means to the substrate body.

16. The substrate as claimed in claim 14, wherein said connection reinforcing means comprises a through section which pierces the integrated land and the substrate body.

17. The substrate as claimed in claim 14, wherein said connection reinforcing means comprises a through pipe which pierces the integrated land and the substrate body from a first surface of the substrate to a second surface thereof.

* * * * *